(12) United States Patent
Shimura et al.

(10) Patent No.: US 7,855,450 B2
(45) Date of Patent: Dec. 21, 2010

(54) CIRCUIT MODULE

(75) Inventors: Toshihiro Shimura, Kawasaki (JP); Yoji Ohashi, Kawasaki (JP); Mitsuji Nunokawa, Nakakoma (JP)

(73) Assignees: Fujitsu Limited, Kawasaki (JP); Eudyna Devices, Inc., Nakakoma, Yamanashi ( * ) Notice: Subject to any disclaimer, the term of this patent is extended or adjusted under 35 U.S.C. 154(b) by 0 days.

(21) Appl. No.: 11/392,675

(22) Filed: Mar. 30, 2006

(65) Prior Publication Data

US 2007/0132094 A1 Jun. 14, 2007

(30) Foreign Application Priority Data

Dec. 12, 2005 (JP) ............... 2005-357228

(51) Int. Cl.
*H01L 23/26* (2006.01)
(52) U.S. Cl. ............... 257/729; 257/528; 257/536; 257/608; 257/678; 257/701; 257/E23.001
(58) Field of Classification Search ............... 257/528, 257/536, 608, 701, 678, 729, E23.003
See application file for complete search history.

(56) References Cited

U.S. PATENT DOCUMENTS

| 5,406,118 | A | | 4/1995 | Saito | |
|---|---|---|---|---|---|
| 5,438,305 | A | * | 8/1995 | Hikita et al. | 333/32 |
| 2001/0035524 | A1 | | 11/2001 | Zehe | |
| 2001/0045626 | A1 | | 11/2001 | Hirose | |
| 2004/0113254 | A1 | * | 6/2004 | Karnezos | 257/686 |
| 2005/0077605 | A1 | * | 4/2005 | Yu et al. | 257/678 |
| 2005/0212406 | A1 | * | 9/2005 | Daniels et al. | 313/503 |
| 2006/0172457 | A1 | * | 8/2006 | Huang | 438/106 |

FOREIGN PATENT DOCUMENTS

| DE | 102 50 636 A1 | | 5/2003 |
|---|---|---|---|
| EP | 0 978 876 A2 | | 2/2000 |
| EP | 0978876 A2 | * | 2/2000 |
| JP | 03 148158 A | | 6/1991 |
| JP | 2003-078066 | | 3/2003 |
| JP | 2005-209921 | | 8/2005 |

OTHER PUBLICATIONS

NPL, Aug. 2000, Thin-film interference.*
Joseph George, C.S. Menon, "Electrical and optical properties of electron beam evaporated ITO thin films", Surface and Coating Technology 132, Feb. 17, 2000, p. 45-48.

* cited by examiner

*Primary Examiner*—Cuong Q Nguyen
*Assistant Examiner*—Trang Q Tran
(74) *Attorney, Agent, or Firm*—Hanify & King, P.C.

(57) ABSTRACT

In a circuit module for a high frequency, a resistance film is formed on a side of a semiconductor circuit chip, mounted above a dielectric substrate through ground metal layers, opposite to the dielectric substrate. A distance from the ground metal layer to the resistance film is a ¼ wavelength at a predetermined frequency, and the resistance film has a sheet resistance equal to a characteristic impedance of air. A second dielectric substrate with the metal layer formed on a side opposite to the resistance film can be mounted. When being adhered to the second dielectric substrate, the resistance film has a characteristic impedance determined by a permittivity of a material of the semiconductor circuit chip. When being formed in space from the semiconductor circuit chip, the resistance film has a sheet resistance equal to a characteristic impedance of air. The thickness of the second dielectric substrate is a ¼ wavelength in a desired frequency.

20 Claims, 11 Drawing Sheets

CIRCUIT MODULE

BACKGROUND OF THE INVENTION

1. Field of the Invention

The present invention relates to a circuit module, and in particular to a circuit module mounting thereon a semiconductor circuit chip used for a high frequency bandwidth of a microwave, a milliwave, or the like.

2. Description of the Related Art

FIGS. 11A and 11B are cross-sectional diagrams of a prior art circuit module; FIG. 11A shows a partially cross-sectional diagram along a line A-A shown in FIG. 11B. FIG. 11B shows a cross-sectional diagram along a line B-B shown in FIG. 11A. In FIGS. 11A and 11B, a ground metal layer 2 is formed above a chip mounting dielectric substrate 1. Above the chip mounting dielectric substrate 1, a signal line 5a is also formed together with the ground metal layer 2. The signal line 5a is connected to a signal line 5 through a metal bump 3. A ground metal layer 4 is formed on a surface of a semiconductor circuit chip 6 on which devices are mainly mounted, in the form of flip-chip.

Also, a cap 9 is formed so as to cover both of the dielectric substrate 1 and the semiconductor circuit chip 6, thereby preventing its breakage and sealing off the semiconductor circuit chip 6. It is to be noted that the signal line 5a is connected to the signal line 5b through a through-hole 8 passing through the dielectric substrate 1, and is further connected to an external circuit.

Besides the above-mentioned circuit module, for a circuit module for a high frequency bandwidth, a high frequency package module has been proposed in which the semiconductor circuit chip is mounted on the dielectric substrate in the form of flip-chip. In this high frequency package module, a plurality of land patterns whose sizes are equal to or less than ½ of a wavelength λ of an operation frequency of the semiconductor circuit chip are formed on a side opposite to the side on which the semiconductor circuit chip of the dielectric substrate is mounted and opposed to the semiconductor circuit chip. Also, a plurality of through-holes filled with metal are formed at intervals of equal to or less than λ/4 in a mounting area above the semiconductor circuit chip of the dielectric substrate (see patent document 1).

In addition, there has been proposed a high-frequency module which can considerably reduce radiation of electromagnetic waves from a surface of a circuit substrate and can suppress a characteristic fluctuation by an attachment of a cap in an arrangement where ground patterns are formed on the highest layer and the lowest layer over the circuit substrate of the module and a circuit pattern which becomes a high-frequency transmission line is formed on an internal layer of the circuit substrate (see e.g. patent document 2).

[Patent Document 1] Japanese Patent Application Laid-open No. 2003-78066

[Patent Document 2] Japanese Patent Application Laid-open No. 2005-209921

In the circuit module as shown in FIGS. 11A and 11B, there has been a problem that unnecessary radiation waves leaking from e.g. the back side (side opposite to the chip mounting dielectric substrate 1, where no circuit is mounted) of the semiconductor circuit chip return to the semiconductor circuit chip 6 through the signal line 5a→metal bump 3→signal line 5, thereby deteriorating the isolation and disturbing a normal operation of the semiconductor circuit chip 6.

For this reason, by affixing a rubber-based wave absorber or the like inside of the cap 9, leaking power has been absorbed. However, the rubber-based wave absorber has been weak in secular variation or aging phenomena, so that there has been a problem in a long-term reliability. Also, there has been fear that if not the rubber-based wave absorber but an organic wave absorber is used, occurrence of out-gas affects the reliability on the semiconductor circuit chip.

SUMMARY OF THE INVENTION

It is accordingly an object of the present invention to provide a circuit module which improves isolation for unnecessary radiation waves having leaked from a semiconductor circuit chip.

(1) In order to achieve the above-mentioned object, a circuit module according to the present invention comprises: a dielectric substrate; a semiconductor circuit chip mounted above the dielectric substrate through a ground metal layer; and a resistance film formed on a side of the semiconductor circuit chip opposite to the dielectric substrate.

Namely, in a circuit module according to the present invention, unnecessary radiation waves leaking from a side of a semiconductor circuit chip opposite to a dielectric substrate where the side is generally a back side but is not hereinafter limited to the back side are absorbed in a resistance film formed on the back side thereof, unnecessary radiation waves leaking from the surface of the semiconductor circuit chip while not limited to the surface are reflected by the ground metal layer to be returned and absorbed (attenuated) in the resistance film formed on the back side. Therefore, the radiation power is greatly attenuated. Thus, a situation can be prevented that the unnecessary radiation waves return from another terminal or the like to deteriorate the isolation.

(1-1) The above-mentioned resistance film may be formed on a back side of the semiconductor circuit chip directly or through a nonconductive adhesive.

(1-2) Also, the above-mentioned ground metal layer may be directly formed on a surface of the semiconductor circuit chip or on the dielectric substrate, and may be placed at a position to function as a reflection layer for the unnecessary radiation waves.

(1-3) Also, a distance from the above-mentioned ground metal layer to the resistance film may preferably comprise a ¼ wavelength at a predetermined frequency. Thus, when the unnecessary radiation waves having been generated within the semiconductor circuit chip are reflected by the ground metal layer to be returned, a standing wave loop generated at the resistance film formed at a position of the ¼ wavelength since a distance from the ground metal layer to the resistance film is the ¼ wavelength, so that its absorption difference (attenuation) becomes larger at the resistance film.

(1-4) Also, a metal cap covering the above-mentioned semiconductor circuit chip and the resistance film may be provided, and a spatial distance from the resistance film to the metal cap may be rendered a ¼ wavelength at the above-mentioned predetermined frequency.

Thus, since a spatial distance from the resistance film to the metal cap is the ¼ wavelength, the unnecessary radiation waves having passed without being absorbed in the resistance film are reflected by the metal cap to be returned. The standing wave loop is generated at the position of the resistance film, so that the unnecessary radiation waves returned can be considerably attenuated at the resistance film.

(1-5) Furthermore, the above-mentioned resistance film may have a resistance equal to a characteristic impedance of air.

Namely, when the sheet resistance of the resistance film is equal to a characteristic impedance of air, the unnecessary radiation waves having leaked from the semiconductor circuit chip are terminated at the resistance film due to the impedance matching between the resistance film and the air surrounding the resistance film. Therefore, power consumption is maximized, so that the radiation waves are attenuated to the utmost.

(2) A second dielectric substrate may be mounted on the resistance film, with the semiconductor circuit chip and the resistance film mounted above the dielectric substrate as mentioned above, and a metal layer may be formed on a side opposite to the resistance film.

Namely, the unnecessary radiation waves having been generated within the semiconductor circuit chip are absorbed in the resistance film. Since the unnecessary radiation waves having leaked without being absorbed reach the metal layer through the second dielectric substrate, the waves are reflected by the metal layer and are also absorbed at the resistance film upon returning. The same applies to the unnecessary radiation waves having leaked from the semiconductor circuit chip to the ground metal layer.

(2-1) The metal layer of the above-mentioned second dielectric substrate may be connected to a radiating cap that covers the semiconductor circuit chip, the resistance film, and the second dielectric substrate.

Thus, it becomes possible to radiate heat having been generated within the semiconductor circuit chip to the cap through the resistance film and the second dielectric substrate.

(2-2) It is preferable that this resistance film is adhered to the above-mentioned second dielectric substrate, and has a resistance equal to a characteristic impedance determined by a permittivity of the material of the semiconductor circuit chip.

Since the resistance film has an impedance matched with that of the semiconductor circuit chip, the unnecessary radiation waves having leaked from the semiconductor circuit chip are attenuated to the utmost by the resistance film. The unnecessary radiation waves having leaked without being attenuated by the resistance film are reflected by the metal layer through the second dielectric substrate in the same way as the above and may be also attenuated by the resistance film.

(2-3) Also, the above-mentioned resistance film may be formed in space from the semiconductor circuit chip without being adhered to the second dielectric substrate, and may be connected to a cap through the metal layer of the second dielectric substrate. This cap covers the semiconductor circuit chip, the resistance film, and the second dielectric substrate in the same way as the above.

Namely, in this case, the resistance film is apart from the semiconductor circuit chip. The unnecessary radiation waves having leaked from the semiconductor circuit chip enter the resistance film through the space, and then pass through the second dielectric substrate from the resistance film. When being reflected by the metal layer of the second dielectric substrate, the radiation waves are attenuated by the resistance film.

(2-4) Furthermore, the above-mentioned second dielectric substrate itself may be formed as a cap covering the semiconductor circuit chip, in which the resistance film may be formed inside the cap in space from the semiconductor circuit chip, while the metal layer may be formed outside the cap.

This second dielectric substrate is substituted for the cap, and the unnecessary radiation waves are similarly attenuated.

(2-5) Furthermore, it is preferable that the above-mentioned resistance film has a sheet resistance equal to a characteristic impedance of air.

Namely, since the semiconductor circuit chip is in space from the resistance film and the resistance film has a sheet resistance equal to the characteristic impedance of air in the space, the unnecessary radiation waves having leaked from the semiconductor circuit chip are attenuated to the utmost by the resistance film whose impedance is matched with that of the space. The unnecessary radiation waves still having leaked are reflected by the metal layer through the second dielectric substrate, and are also attenuated by the resistance film when the waves return.

(2-6) It is preferable that thickness of the above-mentioned second dielectric substrate comprises a ¼ wavelength at a desired frequency.

Namely, the unnecessary radiation waves having leaked from the semiconductor circuit chip are once attenuated by the resistance film. However, they still leak and are inputted to the second dielectric substrate. When the waves are reflected by the metal layer on the other side, the standing wave loop is also generated at the resistance film since the thickness of the dielectric substrate is the ¼ wavelength, thereby enabling the unnecessary radiation waves to be attenuated to the utmost.

The above-mentioned resistance film may be formed in a mesh pattern. Thus, it becomes possible to enhance the sheet resistance of the resistance film at a high frequency or in terms of direct current.

As described above, according to the circuit module of the present invention, regardless of presence/absence of a cap, isolation for the unnecessary radiation waves having leaked from the semiconductor circuit chip can be enhanced. However, if the cap is used and when the semiconductor circuit chip is mounted in the form of face-up, which is opposite to the flip-chip form, this circuit module can accommodate to the absorption of the unnecessary radiation waves specifically from the semiconductor circuit chip.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Hereinafter, embodiments of the circuit module according to the present invention will be described referring to the attached drawings.

Embodiment [1]

Figure 1:
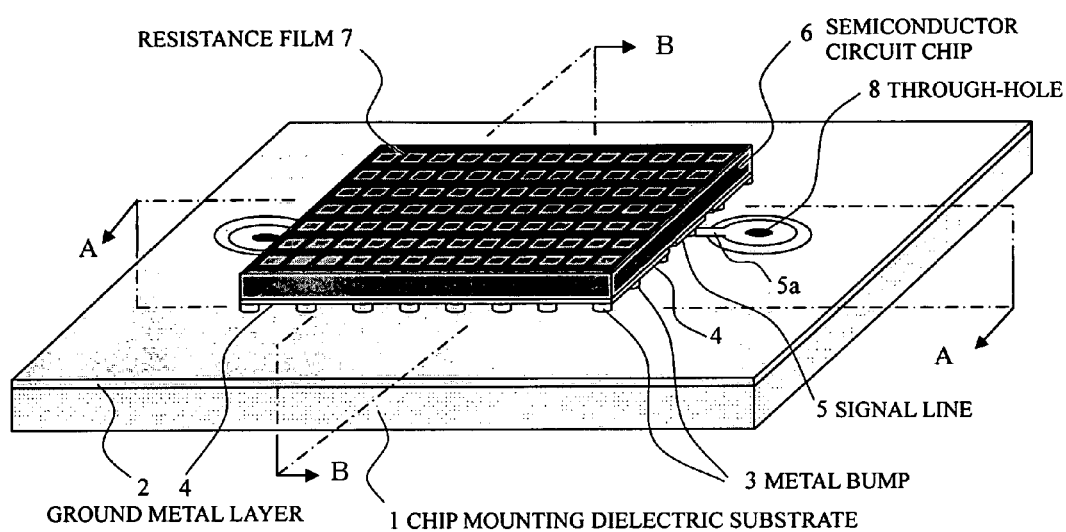
FIG. 1 is a perspective view showing an embodiment [1] (without cap) of a circuit module according to the present invention.
Figure 2A:
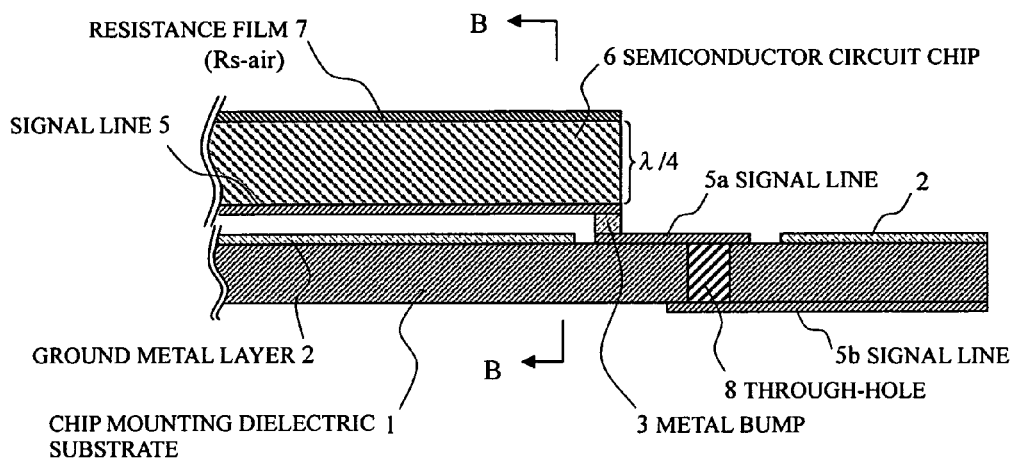
FIGS. 2A and 2B are an A-A partially cross-sectional diagram and a B-B cross-sectional diagram of an embodiment [1] of a circuit module according to the present invention.
Figure 2B:
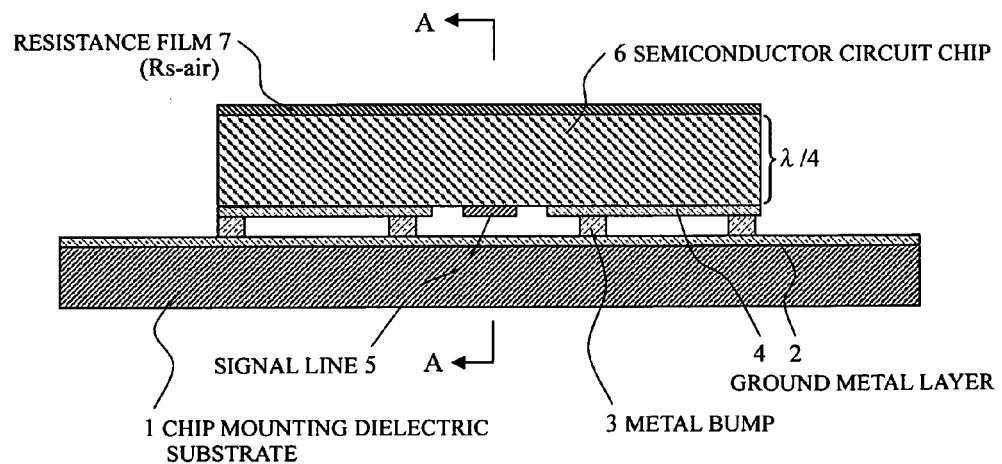

FIGS. 1, 2A, and 2B

FIGS. 1, 2A, and 2B show an embodiment [1] of the circuit module according to the present invention; FIG. 1 specifically shows its perspective view, FIG. 2A shows a partially cross-sectional diagram along the line A-A in FIG. 1, and FIG. 2B shows a cross-sectional diagram along the line B-B.

In the embodiment [1], a ground metal layer 2 and a signal line 5$a$ are formed on a chip mounting dielectric substrate 1. Above the ground metal layer 2 and the signal line 5$a$, a semiconductor circuit chip 6 is provided. On the surface of the semiconductor circuit chip 6, a ground metal layer 4 and a signal line 5 are formed, and on the back side thereof a resistance film 7 is formed. The signal line 5 is connected to the signal line 5$a$ through a metal bump 3. Namely, the signal line 5 is in space from the ground metal layer 2. Also, the signal line 5$a$ is connected to a signal line 5$b$ through a through-hole (via-hole) 8. The signal line 5$b$ is connected to an external circuit.

Figure 11A:
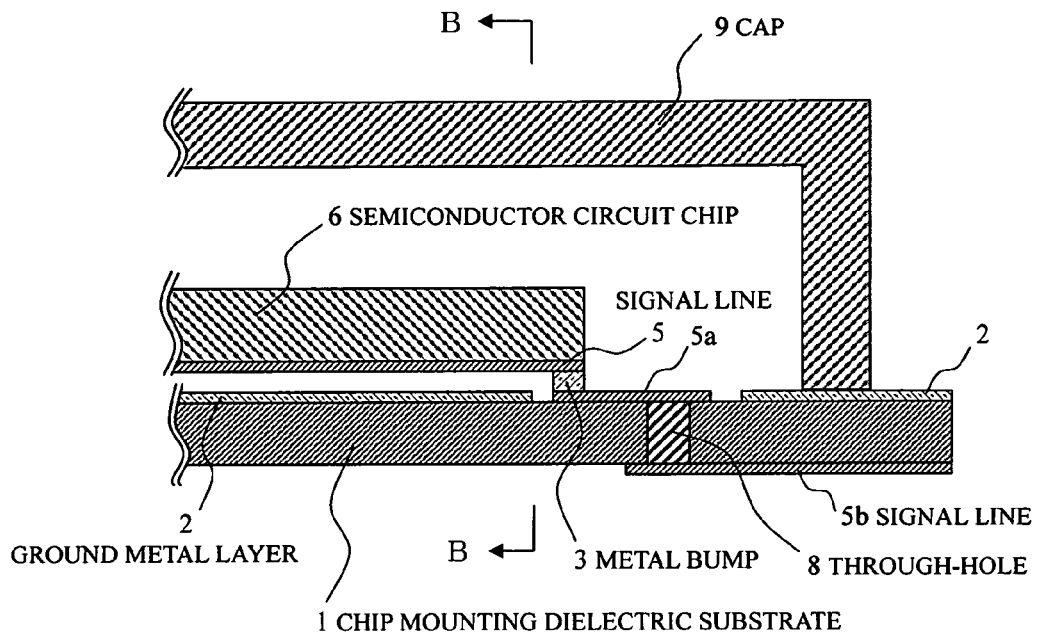
FIGS. 11A and 11B are an A-A partially cross-sectional diagram and a B-B cross-sectional diagram of a prior art circuit module.
Figure 11B:
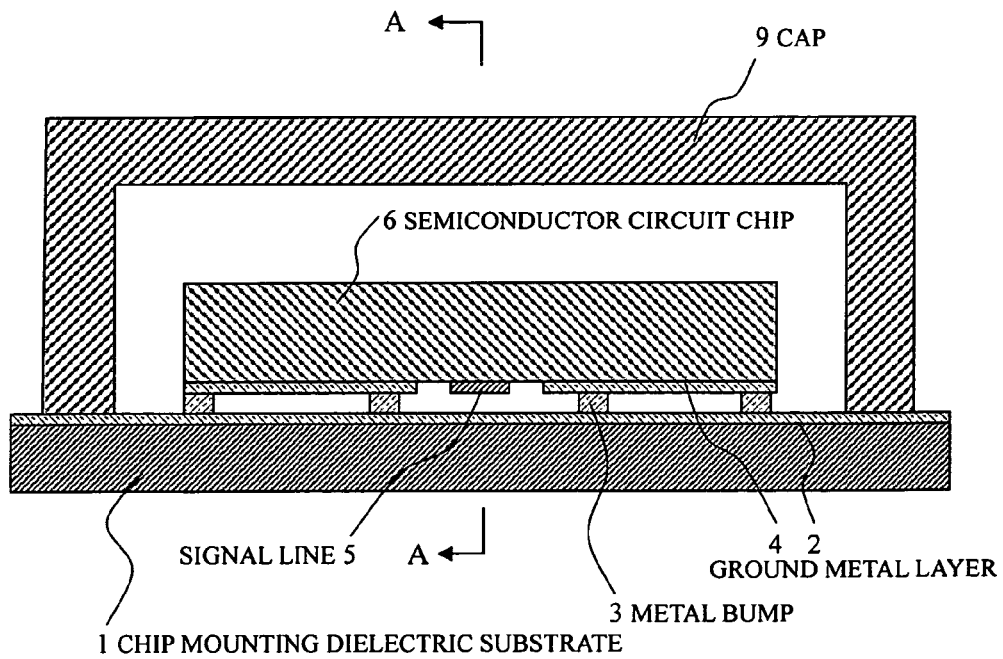

Thus, in the embodiment [1] of the present invention, the resistance film 7 is provided on the back side of the semiconductor circuit chip 6 different from the prior art example shown in FIGS. 11A and 11B, where the cap 9 is not provided in this embodiment [1].

In the embodiment [1], when unnecessary radiation waves leaking from the inside of the semiconductor circuit chip 6 toward the back side of the chip are generated, the power is consumed and the waves are attenuated by the resistance film 7.

At this time, by making the sheet resistance of the resistance film 7 a characteristic impedance of the surrounding air (Rs-air=about 380Ω) (Equation 1: characteristic impedance $Z_0 = \sqrt{(\mu/\epsilon)}$, μ: permeability of medium, ε: permittivity of medium where the medium is air in this case), the impedance matching with the surrounding space can be achieved, so that the power of the unnecessary radiation waves is consumed to the utmost by the resistance film 7 so that the waves are attenuated.

It is to be noted that while the sheet resistance Rs-air of 380Ω can be obtained by an ITO (Indium-Tin-Oxide) film or the like, a resistance on the order of 50-100Ω lower than 380Ω may be used for a general metal resistance. Also, by forming a resistance film of a lower resistance in a mesh pattern, the terminating resistance can be enhanced equivalently.

Also, the unnecessary radiation waves having been generated within the semiconductor circuit chip 6 propagate to the chip surface. Since the ground metal layer 4 and the signal line 5 are formed on the chip surface as a refection layer or a reflection board (see specifically FIG. 2B), and the reflection is effected at this point, the distance from the ground metal layer 4 to the resistance film 7, namely the thickness of the semiconductor circuit chip 6 is rendered a ¼ wavelength at a predetermined frequency, thereby enabling a standing wave loop to be generated at the position of the resistance film 7, so that the standing wave can be highly consumed by the resistance film 7.

Embodiment [2]

Figure 3A:
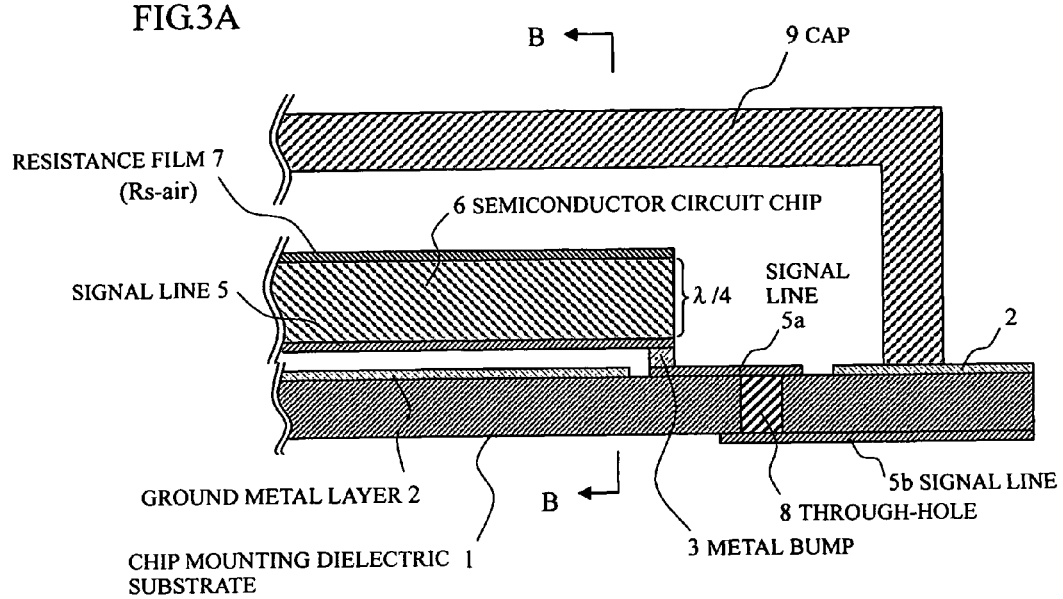
FIGS. 3A and 3B are an A-A partially cross-sectional diagram and a B-B cross-sectional diagram of an embodiment [2] (with cap) of a circuit module according to the present invention.
Figure 3B:
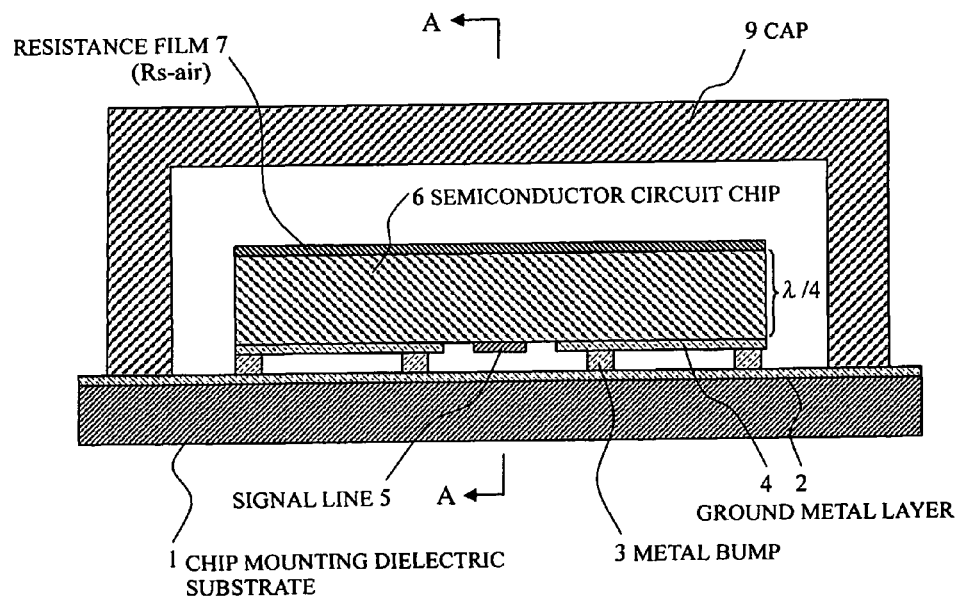

FIGS. 3A and 3B

FIGS. 3A and 3B show an embodiment [2] of the circuit module according to the present invention. This embodiment [2] is different from the embodiment [1] shown in FIGS. 1, 2A, and 2B in that a cap 9 is provided. Although such a perspective view as shown in FIG. 1 is not shown, FIG. 3A shows a cross-sectional diagram corresponding to the cross-sectional diagram along the line A-A in FIG. 1, and FIG. 3B shows a cross-sectional diagram corresponding to the cross-sectional diagram along the line B-B.

The attenuating operation of the unnecessary radiation waves by the resistance film 7 in the embodiment [2] is the same as the above-mentioned embodiment, where in this embodiment [2], the cap 9 has a function of preventing the breakage of the semiconductor circuit chip and sealing off GaAs forming the semiconductor circuit chip 6.

Thus, while the unnecessary radiation waves can be absorbed without the cap in case of the embodiment [1], if the cap is provided like the embodiment [2], it becomes possible to add functions of preventing the breakage and sealing off air as mentioned above.

Embodiment [3]

FIG. 4

Figure 4:
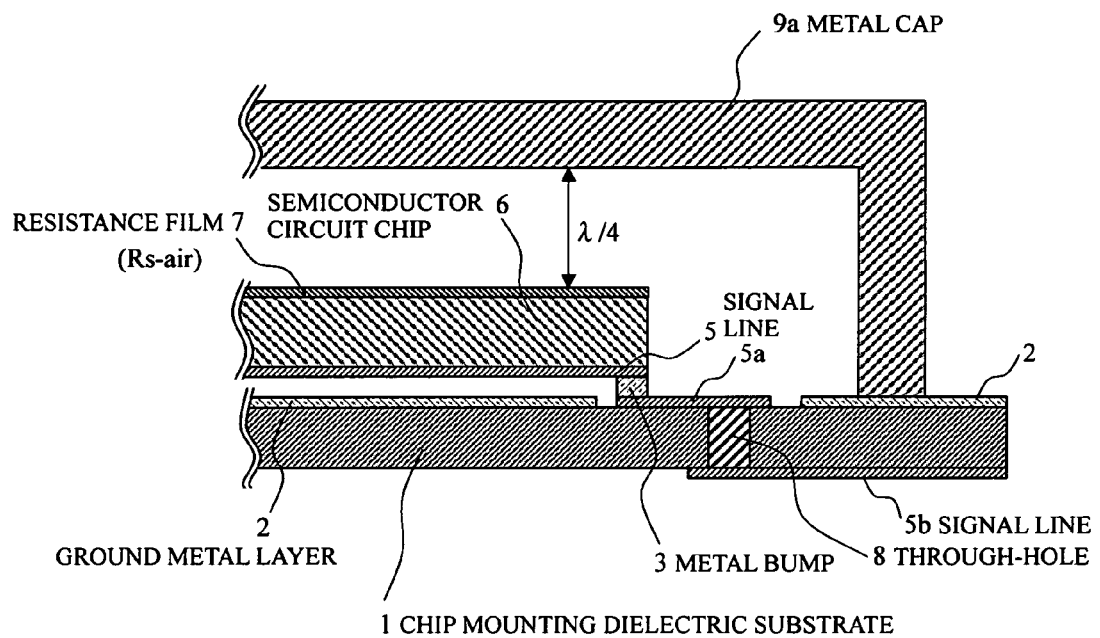
FIG. 4 is a partially cross-sectional diagram of an embodiment [3] (with cap) of a circuit module according to the present invention.

FIG. 4 shows an embodiment [3] of the circuit module according to the present invention. While this embodiment [3] has the same basic arrangement as that of the embodiment [2] shown in FIGS. 3A and 3B, it is different from the embodiment [2] in that a metal cap 9$a$ is used for the cap and the interval between the resistance film 7 and the metal cap 9$a$ is rendered the ¼ wavelength at a predetermined frequency.

Namely, the unnecessary radiation waves having been generated within the semiconductor circuit chip 6 are absorbed (attenuated) in the resistor film 7. When all of the waves are not absorbed, the waves further propagate to the metal cap 9$a$ from the resistance film 7 and are reflected by the metal cap 9$a$.

At this time, by rendering the interval between the metal cap 9$a$ and the resistance film 7 the ¼ wavelength, the reflected unnecessary radiation waves generates a standing wave loop at the resistance film 7, so that the power is highly consumed by the resistance film 7. Therefore, the unnecessary radiation waves reflected by the metal cap 9$a$ are also absorbed in the resistance film 7. For this reason, the metal cap is used for the cap.

Embodiment [4]

Figure 5A:
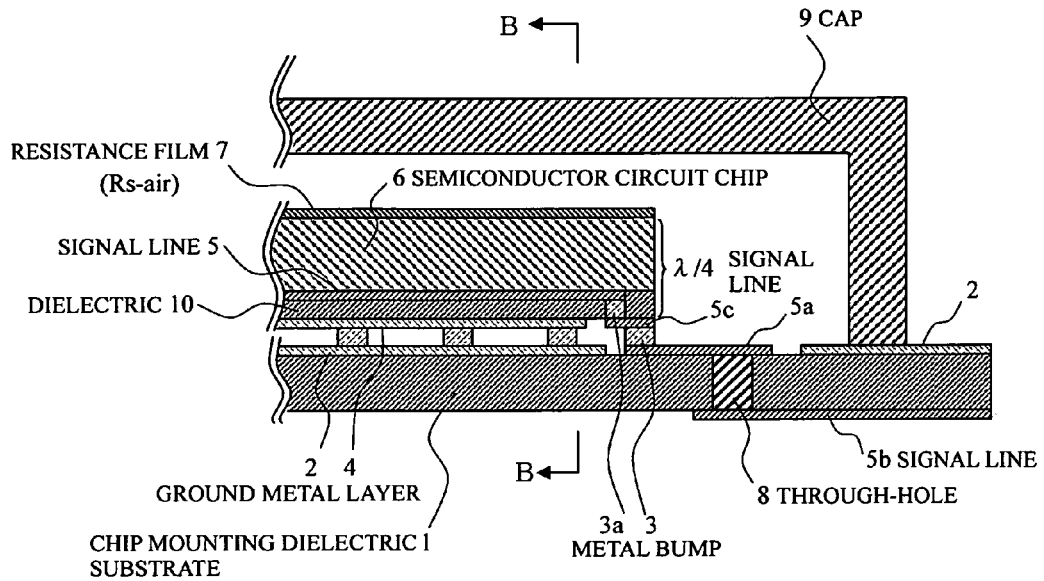
FIGS. 5A and 5B are an A-A partially cross-sectional diagram and a B-B cross-sectional diagram of an embodiment [4] of a circuit module according to the present invention.
Figure 5B:
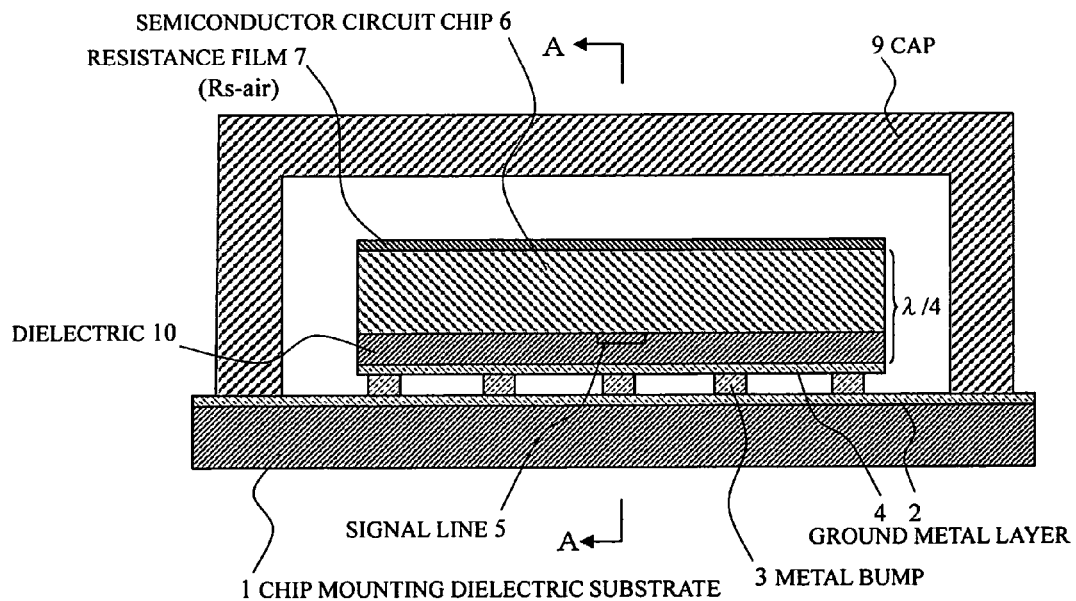

FIGS. 5A and 5B

FIGS. 5A and 5B show an embodiment [4] of the circuit module according to the present invention. While this embodiment [4] is basically the same as the embodiment [2] shown in FIGS. 3A and 3B, it is different from the embodiment [2] in that as shown in the A-A cross-sectional diagram of FIG. 5A and the B-B cross-sectional diagram of FIG. 5B only the signal line 5 is directly formed on the surface of the semiconductor circuit chip 6 and the ground metal layer 4 is formed through a dielectric 10. Therefore, the signal line 5 is connected to the signal line 5a through the metal bump 3a, a signal line 5c, and the metal bump 3. The thickness in which the respective thicknesses of the semiconductor circuit chip 6 and the dielectric 10 are added, i.e. the interval between the resistance film 7 and the ground metal layer 4 is rendered the ¼ wavelength.

The operation concerning the unnecessary radiation waves in the embodiment [4] is the same as that in the embodiment [2] shown in FIGS. 3A and 3B.

Embodiment [5]

Figure 6:
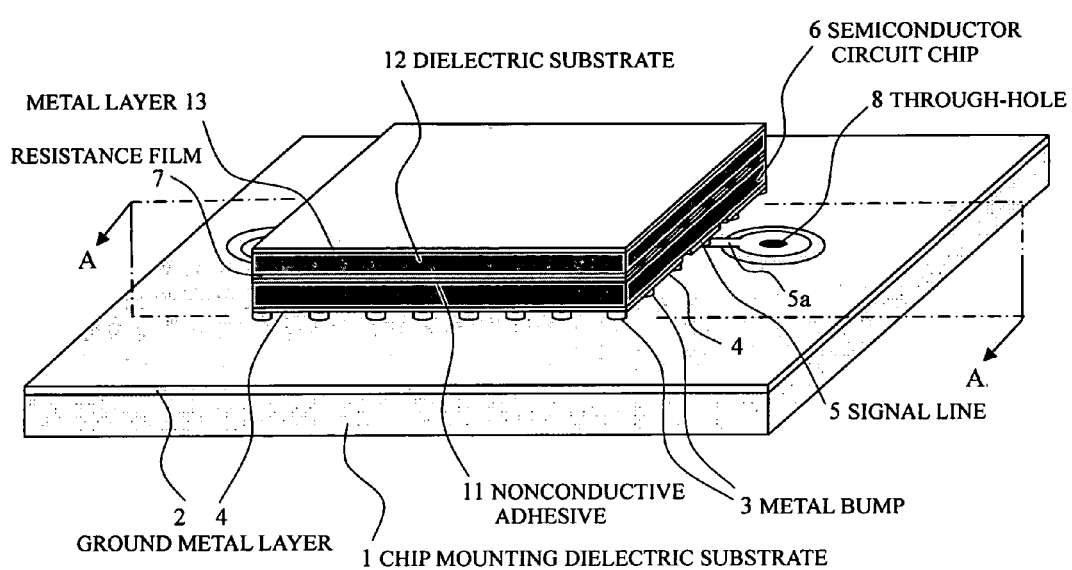
FIG. 6 is a perspective view showing an embodiment [5] (without cap) of a circuit module according to the present invention.
Figure 7:
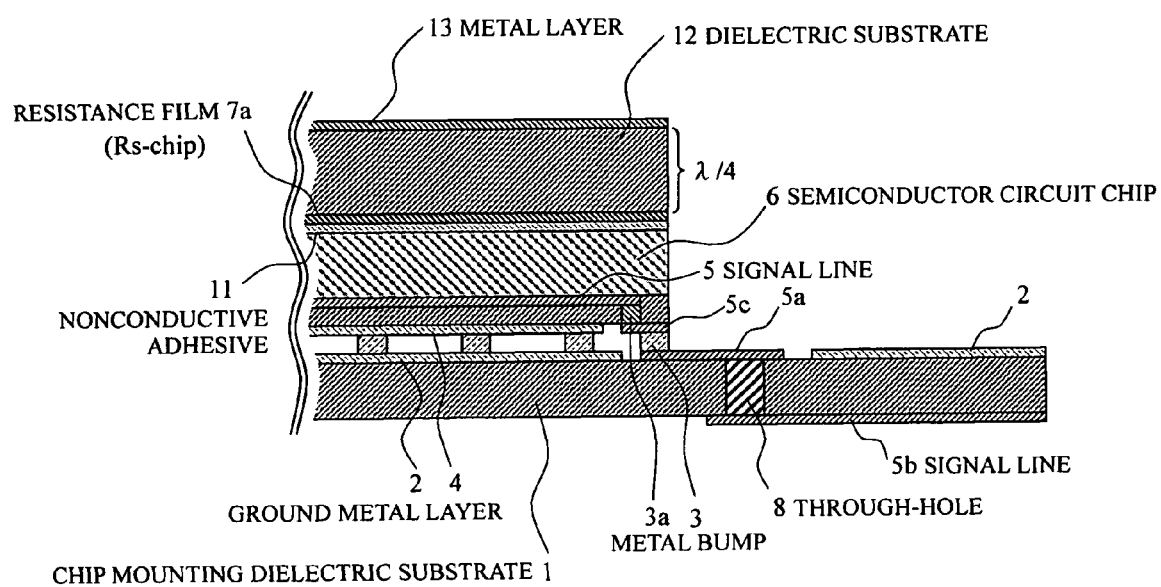
FIG. 7 is a partially cross-sectional diagram of an embodiment [5] of a circuit module according to the present invention.

FIGS. 6 and 7

FIGS. 6 and 7 show an embodiment [5] of the circuit module according to the present invention. As seen from FIGS. 6 and 7, the embodiment [5] is different from the embodiment [4] shown in FIGS. 5A and 5B in that the cap is not used and a dielectric substrate 12 on the lower side of which a resistance film 7a is formed and on the upper side of the metal layer 13 is formed is adhered to the back side of the semiconductor circuit chip 6 with a nonconductive adhesive 11.

In the embodiment [5], the sheet resistance of the resistance film 7a has a resistance Rs-chip equal to the characteristic impedance determined by the permittivity of material of the semiconductor circuit chip 6. Since the relative permittivity of the chip material is generally larger than 1, the resistance for matching the impedance can be set lower by Equation 1. In the case of GaAs (relative permittivity –13), the resistance can be set low such as about 100Ω.

Also, the thickness of the dielectric substrate 12 is rendered the ¼ wavelength.

Accordingly, as for the unnecessary radiation waves generated from the semiconductor circuit chip 6 and propagating to the back side of the chip, the impedance of the resistance film 7a matches with that of the semiconductor circuit chip 6. Therefore, the radiation waves are terminated by the resistance film 7a, and can be absorbed in a state where the power consumption of the unnecessary radiation waves having leaked is maximized.

Although the unnecessary radiation waves which the resistance film 7a has failed to absorb further propagate to the dielectric substrate 12, the waves are reflected by the metal layer 13, become a standing wave loop at the resistance film 7a located at the ¼ wavelength corresponding to the thickness of the dielectric, and are also highly absorbed in the resistance film 7a.

It is to be noted that since the unnecessary radiation waves are terminated by the sheet resistance of the resistance film 7a by rendering the thickness of the dielectric substrate 12 mounted on the back side of the semiconductor circuit chip 6 the ¼ wavelength, the thickness of the semiconductor circuit chip 6 need not necessarily be the ¼ wavelength.

Embodiment [6]

FIG. 8

Figure 8:
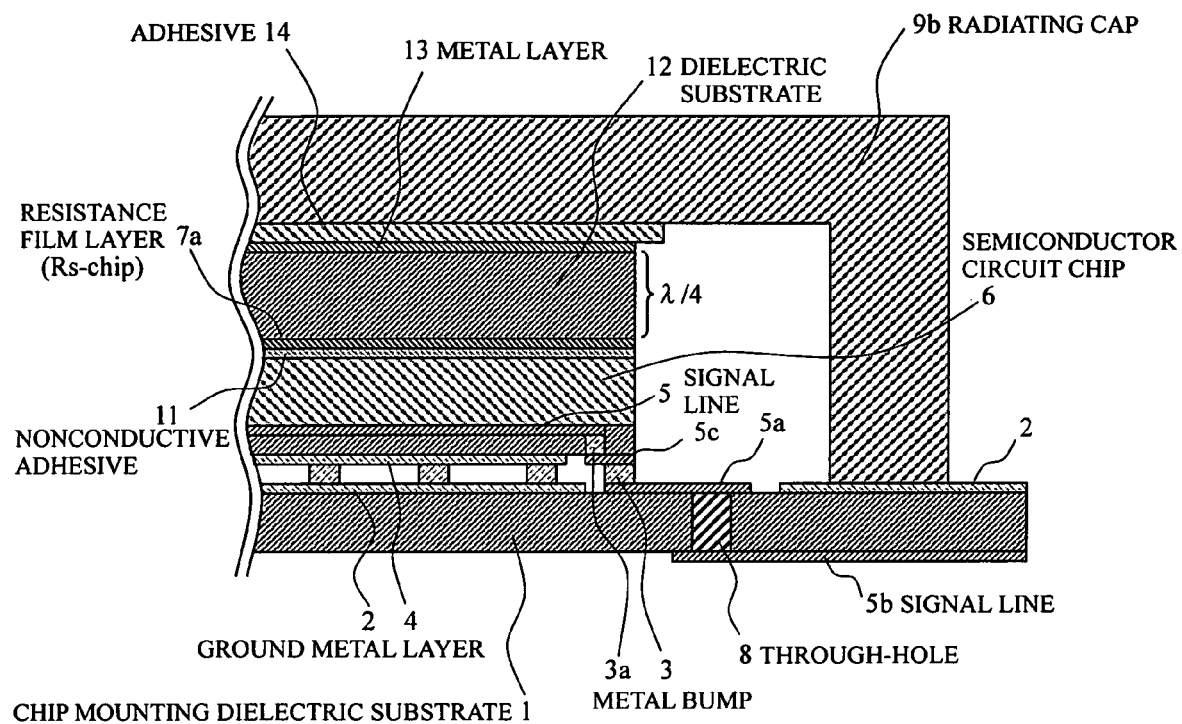
FIG. 8 is a partially cross-sectional diagram of an embodiment [6] (with cap) of a circuit module according to the present invention.

FIG. 8 shows an embodiment [6] of the circuit module according to the present invention. This embodiment [6] is different from the embodiment [5] shown in FIG. 7 in that a radiating cap 9b is attached and the metal layer 13 and the radiating cap 9b are adhered thereto adhesive 14.

Namely, in the embodiment [6], it becomes possible to let out the heat generated at the semiconductor circuit chip 6 to the radiating cap 9b through the resistance film 7a, the metal layer 13, and the adhesive 14.

Embodiment [7]

FIG. 9

Figure 9:
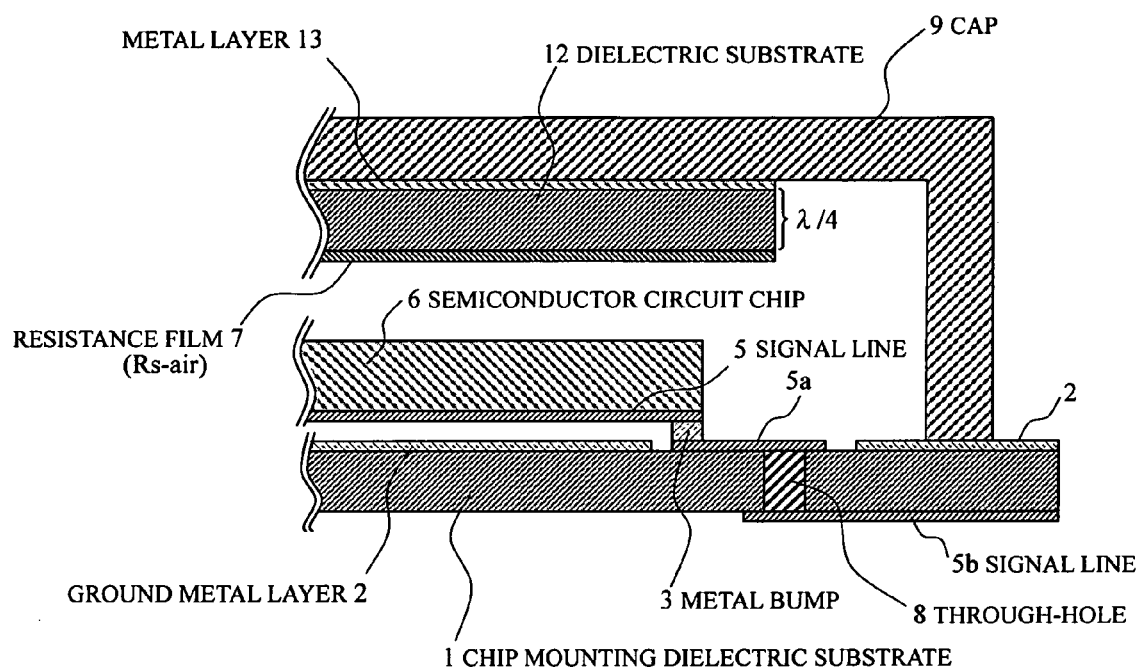
FIG. 9 is a partially cross-sectional diagram of an embodiment [7] of a circuit module according to the present invention.

FIG. 9 shows a partially cross-sectional diagram of the embodiment [7] of the circuit module according to the present invention. This embodiment [7] is different from the embodiment [6] shown in FIG. 8 in that a space is provided in the back side of the semiconductor circuit chip 6 and the dielectric substrate 12 on which the resistance film 7 and the metal layer 13 are mounted is adhered to the cap 9. It is to be noted that the adhesive between the metal layer 13 and the cap 9 is omitted.

In the embodiment [7], the dielectric substrate 12 has a thickness of the ¼ wavelength in the same way as the embodiment [6], and the resistance film 7 provided on the lower side of the dielectric substrate 12 and on the side of the semiconductor circuit chip 6 has the sheet resistance Rs-air equal to the characteristic impedance in the space with the semiconductor circuit chip 6.

In the embodiment [7], the unnecessary radiation waves having leaked from the back side of the semiconductor circuit chip 6 are terminated and absorbed in the resistance film 7 whose impedance matches with that of the space.

The unnecessary radiation waves which the resistance film 7 has failed to absorb further pass through the dielectric substrate 12. However, if the waves are reflected by the metal layer 13, they become a standing wave loop at the resistance film 7 located at the position of the ¼ wavelength. Therefore, the unnecessary radiation waves are also absorbed highly in the resistance film 7. It is to be noted in the embodiment [7], the thickness of the semiconductor circuit chip 6 need not necessarily be the ¼ wavelength.

Embodiment [8]

FIG. 10

Figure 10:
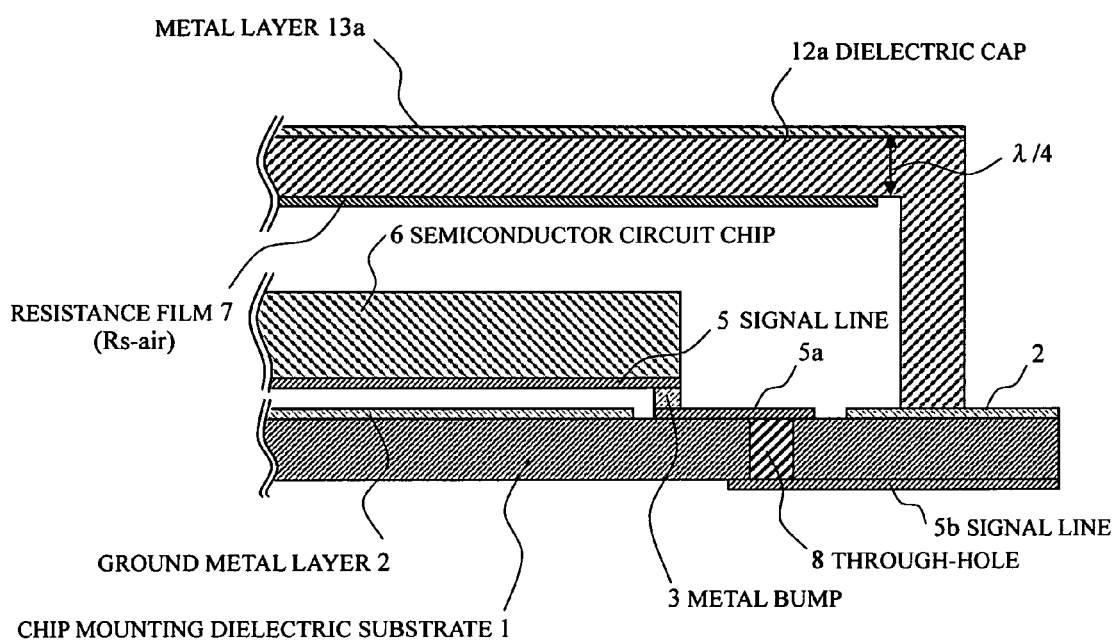
FIG. 10 is a partially cross-sectional diagram of an embodiment [8] of a circuit module according to the present invention.

FIG. 10 shows a partially cross-sectional diagram of the embodiment [8] of the circuit module according to the present invention. This embodiment [8] is different from the embodiment [7] shown in FIG. 9 in that the dielectric substrate 12 itself is used as a cap. Namely, a dielectric cap 12a on the lower side of which the resistance film 7 is formed above the semiconductor circuit chip 6 and on the upper side of which a metal layer 13a is formed is formed in order to cover the semiconductor circuit chip 6.

The operation concerning the unnecessary radiation waves of the embodiment [8] is the same as that of the embodiment [7] shown in FIG. 9, and has an advantage that any other cap is not required.

It is to be noted that the present invention is not limited by the above-mentioned embodiments, and it is obvious that various modifications may be made by one skilled in the art based on the recitation of the claims.

What is claimed is:

1. A circuit module comprising:
   a dielectric substrate;
   a semiconductor circuit chip mounted above the dielectric substrate through a ground metal layer; and
   a film directly formed on one surface of the semiconductor circuit chip opposite to the other surface of the semiconductor circuit chip mounted on the dielectric substrate, having a sheet resistance value enabling electromagnetic waves to be absorbed and different from a sheet resistance value of the ground metal layer,
   wherein the sheet resistance value of the film is equal to a characteristic impedance of a medium contacting the film.

2. The circuit module as claimed in claim 1, wherein the film is formed on one surface of the semiconductor circuit chip directly or through a nonconductive adhesive.

3. The circuit module as claimed in claim 1, wherein the ground metal layer is directly formed on the other surface of the semiconductor circuit chip or on the dielectric substrate.

4. The circuit module as claimed in claim 1, wherein a distance from the ground metal layer to the film comprises a ¼ wavelength at an operating frequency.

5. The circuit module as claimed in claim 1, further comprising a metal cap covering the semiconductor circuit chip and the film,
   a spatial distance from the film to the metal cap being rendered a ¼ wavelength at an operating frequency.

6. The circuit module as claimed in claim 1, wherein the film has a sheet resistance value equal to a characteristic impedance of air.

7. The circuit module as claimed in claim 1, further comprising a second dielectric substrate mounted on the film, with a metal layer formed on a side opposite to the film.

8. The circuit module as claimed in claim 7, wherein the metal layer of the second dielectric substrate is adhered to a radiating cap, and the semiconductor circuit chip, the film, and the second dielectric substrate are covered with the cap.

9. The circuit module as claimed in claim 7, wherein the film is adhered to the second dielectric substrate, and has a sheet resistance value equal to a characteristic impedance determined by a permittivity of a material of the semiconductor circuit chip.

10. The circuit module as claimed in claim 7, wherein the film is formed in space from the semiconductor circuit chip and is adhered to a cap through the metal layer of the second dielectric substrate, and the semiconductor circuit chip, the film, and the second dielectric substrate are covered with the cap.

11. The circuit module as claimed in claim 9, wherein the second dielectric substrate is formed as a cap covering the semiconductor circuit chip and the film is adhered inside the cap in space from the semiconductor circuit chip, and the metal layer is formed outside the cap.

12. The circuit module as claimed in claim 10, wherein the film has a sheet resistance value equal to a characteristic impedance of air.

13. The circuit module as claimed in claim 7, wherein a thickness of the second dielectric substrate comprises a ¼ wavelength at an operating frequency.

14. The circuit module as claimed in claim 1, wherein the film is formed in a mesh pattern.

15. The circuit module as claimed in claim 1, wherein the film has a sheet resistance value equal to a characteristic impedance of air.

16. The circuit module as claimed in claim 3, wherein the film has a sheet resistance value equal to a characteristic impedance of air.

17. The circuit module as claimed in claim 4, wherein the film has a sheet resistance value equal to a characteristic impedance of air.

18. The circuit module as claimed in claim 5, wherein the film has a sheet resistance value equal to a characteristic impedance of air.

19. The circuit module as claimed in claim 8, wherein the film is adhered to the second dielectric substrate, and has a sheet resistance value equal to a characteristic impedance determined by a permittivity of a material of the semiconductor circuit chip.

20. The circuit module as claimed in claim 11, wherein the film has
   a sheet resistance value equal to a characteristic impedance of air.

* * * * *